US012666825B2

(12) United States Patent
You

(10) Patent No.: US 12,666,825 B2
(45) Date of Patent: Jun. 23, 2026

(54) DISPLAY APPARATUS WITH MULTILAYERED CONDUCTIVE LAYER

(71) Applicant: SAMSUNG DISPLAY CO., LTD., Yongin-si (KR)

(72) Inventor: Chungi You, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 457 days.

(21) Appl. No.: 18/202,635

(22) Filed: May 26, 2023

(65) Prior Publication Data

US 2024/0065050 A1 Feb. 22, 2024

(30) Foreign Application Priority Data

Aug. 18, 2022 (KR) ......................... 10-2022-0103339

(51) Int. Cl.
H10K 59/131 (2023.01)
(52) U.S. Cl.
CPC .................................. H10K 59/131 (2023.02)
(58) Field of Classification Search
CPC .................................................... H10K 59/131
See application file for complete search history.

(56) References Cited

U.S. PATENT DOCUMENTS 6,094,375 A 7/2000 Lee
9,299,757 B2 3/2016 Ko

| 2011/0114956 A1* | 5/2011 | Park | H10K 59/80517 |
| | | | 257/E51.027 |
| 2013/0221381 A1* | 8/2013 | Shin | H10D 86/021 |
| | | | 438/34 |
| 2014/0292622 A1 | 10/2014 | Lee | |
| 2014/0353622 A1* | 12/2014 | You | H10K 59/873 |
| | | | 257/40 |
| 2015/0115256 A1* | 4/2015 | You | H10K 59/1216 |
| | | | 257/40 |
| 2016/0020422 A1* | 1/2016 | Kim | H10K 59/80522 |
| | | | 257/40 |
| 2017/0012094 A1* | 1/2017 | Lee | H10K 59/131 |

(Continued)

FOREIGN PATENT DOCUMENTS

| JP | 2003241687 A | 8/2003 |
| JP | 2020004717 A | 1/2020 |

(Continued)

*Primary Examiner* — Lex H Malsawma
(74) *Attorney, Agent, or Firm* — CANTOR COLBURN LLP

(57) ABSTRACT

A display apparatus includes a substrate, a semiconductor layer disposed on the substrate, where the semiconductor layer includes a source region and a drain region, a gate insulating layer disposed on the semiconductor layer, a first conductive layer disposed on the gate insulating layer, an interlayer insulating layer disposed on the first conductive layer, a second conductive layer including a first layer including a first metal and disposed on the interlayer insulating layer, a second layer including a second metal and disposed on the first layer, and a third layer including the first metal and disposed on the second layer, a first organic insulating layer disposed on the second conductive layer, and a third conductive layer disposed on the first organic insulating layer, where the third conductive layer has an area smaller than an area of the second conductive layer.

18 Claims, 14 Drawing Sheets

(56)          References Cited

U.S. PATENT DOCUMENTS

| | | | | |
|---|---|---|---|---|
| 2017/0062548 A1* | 3/2017 | Han | ................. | H10K 59/80522 |
| 2017/0278867 A1* | 9/2017 | Jeong | ................... | H10D 86/451 |
| 2017/0345882 A1* | 11/2017 | Nam | ................... | H10K 71/166 |
| 2020/0135819 A1 | 4/2020 | Kim et al. | | |
| 2020/0235196 A1 | 7/2020 | Lee et al. | | |
| 2022/0020837 A1 | 1/2022 | Kim et al. | | |
| 2022/0028963 A1 | 1/2022 | Lee et al. | | |
| 2022/0102390 A1* | 3/2022 | Lee | .................... | G02F 1/16756 |

FOREIGN PATENT DOCUMENTS

| | | |
|---|---|---|
| JP | 2020115201 A | 7/2020 |
| KR | 100252057 B1 | 5/2000 |
| KR | 20140118010 A | 10/2014 |
| KR | 20200049713 A | 5/2020 |
| KR | 20200087368 A | 7/2020 |
| KR | 102257978 B1 | 5/2021 |
| KR | 1020220010622 A | 1/2022 |

* cited by examiner 41, 42, 43

TH4

DISPLAY APPARATUS WITH MULTILAYERED CONDUCTIVE LAYER

This application claims priority to Korean Patent Application No. 10-2022-0103339, filed on Aug. 18, 2022, and all the benefits accruing therefrom under 35 U.S.C. § 119, the content of which in its entirety is herein incorporated by reference.

BACKGROUND

1. Field

The disclosure relates to a display apparatus, and more particularly, to a display apparatus in which the occurrence of hillock phenomenon may be effectively prevented or substantially minimized.

2. Description of the Related Art

Among display apparatuses, organic light-emitting display apparatuses have a wide viewing angle, a high contrast ratio, and a high response speed, and thus, are attracting attention as a next-generation display apparatus.

A wiring layer for an electrode used in a display apparatus typically includes a metallic material, and when aluminum, which is a metallic material widely used in the art, is heated, a hillock phenomenon may occur.

SUMMARY

When a hillock phenomenon occurs in a wiring layer of a display apparatus, the display apparatus may be determined to be defective in a defect inspection process.

One or more embodiments include a display apparatus in which the occurrence of hillock phenomenon may be effectively prevented or substantially minimized.

According to one or more embodiments, a display apparatus may include a substrate, a semiconductor layer disposed on the substrate, where the semiconductor layer includes a source region and a drain region, a gate insulating layer disposed on the semiconductor layer, a first conductive layer disposed on the gate insulating layer, an interlayer insulating layer disposed on the first conductive layer, a second conductive layer including a first layer including a first metal and disposed on the interlayer insulating layer, a second layer including a second metal and disposed on the first layer, and a third layer including the first metal and disposed on the second layer, a first organic insulating layer disposed on the second conductive layer, and a third conductive layer disposed on the first organic insulating layer, where the third conductive layer has an area smaller than an area of the second conductive layer.

In an embodiment, the first layer may have a first thickness, the second layer may have a second thickness, the third layer may have a third thickness, and the third thickness may be about 500 angstrom (Å) or greater and about 700 Å or less.

In an embodiment, the third thickness may be less than or equal to the first thickness.

In an embodiment, the first metal may include titanium, and the second metal may include aluminum (Al).

In an embodiment, the first organic insulating layer may include a material which is formed at a temperature of about 250 degrees Celsius or greater and about 300 degrees Celsius or less.

In an embodiment, the display apparatus may further include a second organic insulating layer disposed on the third conductive layer, a pixel electrode disposed on the second organic insulating layer and connected to the third conductive layer through a through hole defined in the second organic insulating layer, a pixel-defining layer disposed on the second organic insulating layer and covering an edge of the pixel electrode, and a spacer disposed on the pixel-defining layer.

In an embodiment, the display apparatus may further include a first pad disposed on the substrate, a second pad disposed on the first pad, and a third pad disposed on the second pad.

In an embodiment, the second pad may include a first pad layer including the first metal, a second pad layer including the second metal and disposed on the first pad layer, and a third pad layer including the first metal and disposed on the second pad layer.

In an embodiment, the first pad layer may have a fourth thickness, the second pad layer may have a fifth thickness, the third pad layer may have a sixth thickness, and the sixth thickness may be about 500 Å or greater and about 700 Å or less.

In an embodiment, the sixth thickness may be less than or equal to the fourth thickness.

In an embodiment, the first metal may include titanium (Ti), and the second metal may include aluminum (Al).

In an embodiment, the first pad may include a same material as the first conductive layer and may have a same layer structure as the first conductive layer, and the second pad may include a same material as the second conductive layer and may have a same layer structure as the second conductive layer.

In an embodiment, the interlayer insulating layer may be disposed between the first pad and the second pad, and the second pad may be connected to the first pad through a through hole defined in the interlayer insulating layer.

In an embodiment, the third pad may cover an entire portion of a top surface of the second pad.

In an embodiment, the top surface of the second pad may be in direct contact with the third pad.

In an embodiment, the third conductive layer may include a fourth layer including the first metal and disposed on the first organic insulating layer, a fifth layer including the second metal and disposed on the fourth layer, and a sixth layer including the first metal and disposed on the fifth layer.

In an embodiment, the fourth layer may have a seventh thickness, the fifth layer may have an eighth thickness, the sixth layer may have a ninth thickness, and the ninth thickness may be about 500 Å or greater and about 700 Å or less.

In an embodiment, the ninth thickness may be less than or equal to the seventh thickness.

In an embodiment, the first metal may include titanium (Ti), and the second metal may include aluminum (Al).

In an embodiment, the second organic insulating layer may include a material which is formed at a temperature of about 250 degrees Celsius or greater and about 300 degrees Celsius or less.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
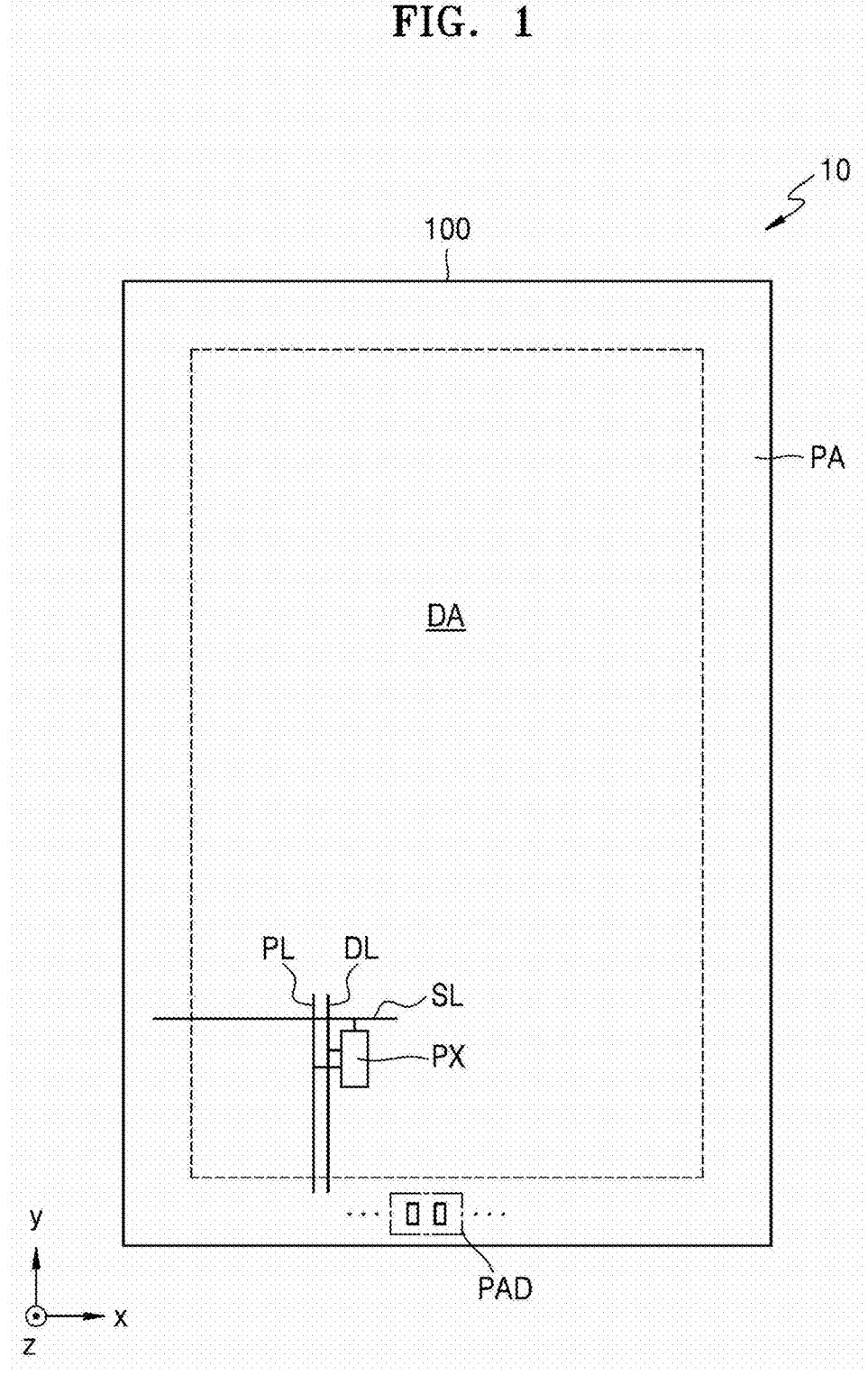
FIG. 1 is a schematic plan view of a portion of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Sizes of components in the drawings may be exaggerated or reduced for convenience of explanation. In other words, since sizes and thicknesses of components in the drawings are arbitrarily illustrated for convenience of explanation, the following embodiments are not limited thereto.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. The expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the following embodiment, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings, and in the description with reference to the drawings, the same or corresponding components are indicated by the same reference numerals and any repetitive detailed descriptions thereof may be omitted.

FIG. 1 is a schematic plan view of a portion of a display apparatus according to an embodiment.

As shown in FIG. 1, the display apparatus according to an embodiment includes a display panel 10. The display apparatus may be any display apparatus or any electronic device that includes the display panel 10. In an embodiment, for example, the display apparatus may be various apparatuses, such as smartphones, tablet personal computers (PCs), televisions, or billboards.

The display panel 10 includes a display area DA and a peripheral area PA arranged outside the display area DA. FIG. 1 illustrates an embodiment where the display area DA has a rectangular shape. However, the disclosure is not limited thereto. The display area DA may have various shapes, such as a circle, an oval, a polygon, or a specific shape.

The display area DA displays an image, and a plurality of pixels PX may be arranged in the display area DA. Each of the pixels PX may include a display element, such as an organic light-emitting diode (OLED). Each of the pixels PX may emit light, for example, red light, green light, or blue light. The pixel PX may be connected to a pixel circuit including a thin-film transistor (TFT) and a storage capacitor. The pixel circuit may be connected to a scan line SL configured to transfer a scan signal, a data line DL intersecting with the scan line SL and configured to transfer a data signal, and a driving voltage line PL intersecting with the scan line SL and configured to supply a driving voltage. The scan line SL may extend in an x-axis direction (hereinafter, x direction), and the data line DL and the driving voltage line PL may extend in a y-axis direction (hereinafter, y direction). Here, a z-axis direction (or z direction) may be a direction perpendicular to the x direction and the y direction, or may be a thickness direction of the display panel 10.

The pixel PX may emit light having a luminance corresponding to an electrical signal from the pixel circuit electrically connected thereto. The display area DA may display a certain image through light emitted from the pixels PX. The pixel PX may be defined as an emission area for emitting light of any one color among red, green, and blue, as described above.

The peripheral area PA is where the pixels PX are not arranged, and may not display an image. A power supply line configured to drive the pixel PX may be arranged in the peripheral area PA. In addition, a pad, to which a printed circuit board including a driving circuit unit or an integrated circuit (IC) element, such as a driver IC, is electrically connected, may be arranged in the peripheral area PA.

The display panel 10 includes a substrate 100, and thus, the substrate 100 may include the display area DA and the peripheral area PA.

In addition, a plurality of transistors may be arranged in the display area DA. Depending on the type of transistor (N-type or P-type) among the plurality of transistors and/or operating conditions thereof, a first terminal of the transistor may be a source electrode or a drain electrode, and a second terminal thereof may be an electrode different from the first terminal. In an embodiment, for example, where the first terminal is a source electrode, the second terminal may be a drain electrode.

The plurality of transistors may include a driving transistor, a data write transistor, a compensation transistor, an initialization transistor, and a light-emitting control transistor. The driving transistor may be connected between the driving voltage line PL and the OLED, and the data write transistor may be connected to the data line DL and the driving transistor and may be configured to perform a switching operation of transferring a data signal transferred through the data line DL.

The compensation transistor may be turned on in response to a scan signal transferred through the scan line SL to connect the driving transistor to the OLED, thereby compensating for a threshold voltage of the driving transistor.

The initialization transistor may be turned on in response to a scan signal transferred through the scan line SL to transfer an initialization voltage to a gate electrode of the driving transistor, thereby initializing the gate electrode of the driving transistor. The scan line SL connected to the initialization transistor may be a separate scan line different from the scan line SL connected to the compensation transistor.

The light-emitting control transistor may be turned on in response to a light-emitting control signal transferred through a light-emitting control line, and as a result, a driving current may flow through the OLED.

Some of the plurality of transistors may include an oxide semiconductor. In an embodiment, for example, the compensation transistor and the initialization transistor may include an oxide semiconductor.

Polysilicon has a high reliability, and thus, polysilicon may precisely control an intended current to flow. Therefore, the driving transistor that directly affects the brightness of a display apparatus may include a semiconductor layer including polysilicon having a high reliability to implement a high-resolution display apparatus. Since the oxide semiconductor has a high carrier mobility and a low leakage current, a voltage drop is not large even though a driving time is long. In other words, even during a low-frequency driving, a color change of an image depending on a voltage drop is not large, and thus, the oxide semiconductor may be driven at low frequencies. Accordingly, in an embodiment, the compensation transistor and the initialization transistor include an oxide semiconductor to implement a display apparatus such that the occurrence of leakage current is effectively prevented and power consumption is also substantially reduced.

The oxide semiconductor is sensitive to light, and thus, variations in an amount of current may occur due to light from the outside. Therefore, in an embodiment, a metal layer may be disposed under the oxide semiconductor to absorb or reflect the light from the outside. Gate electrodes may be disposed above and under each of a compensation transistor and an initialization transistor, each including an oxide semiconductor, respectively. In other words, when viewed in a direction perpendicular to a top surface of the substrate 100 (i.e., the z-axis direction or the z direction), a metal layer disposed under the oxide semiconductor may overlap the oxide semiconductor.

The OLED may include a pixel electrode (or first electrode, for example, an anode) and an opposite electrode (or second electrode, for example, a cathode), and the opposite electrode may receive a common voltage. The OLED may receive the driving current from the driving transistor and emit light to display an image.

Hereinafter, embodiments where the display apparatus is an organic light-emitting display apparatus will be described in detail, but the display apparatus of the disclosure is not limited thereto. In an alternative embodiment, the display apparatus of the disclosure may be an inorganic light-emitting display (or inorganic electroluminescent (EL) display) or a quantum dot light-emitting display. In embodiments, for example, an emission layer of the display element included in the display apparatus may include an organic material or an inorganic material. In addition, the display apparatus may include an emission layer and quantum dots located on a path of light emitted from the emission layer.

Figure 2:
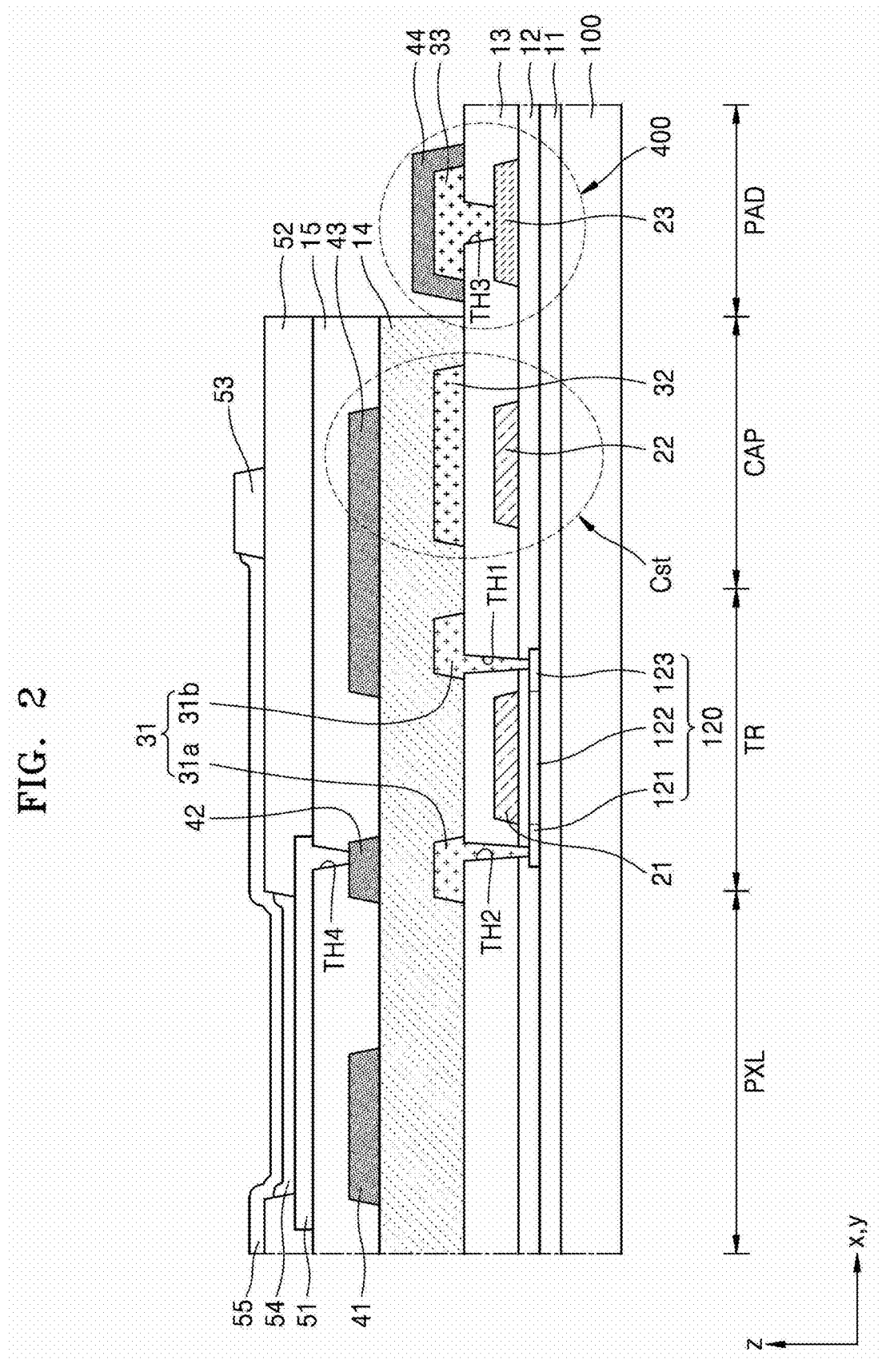
FIG. 2 is a schematic cross-sectional view of a portion of a display apparatus according to an embodiment.
Figure 3:
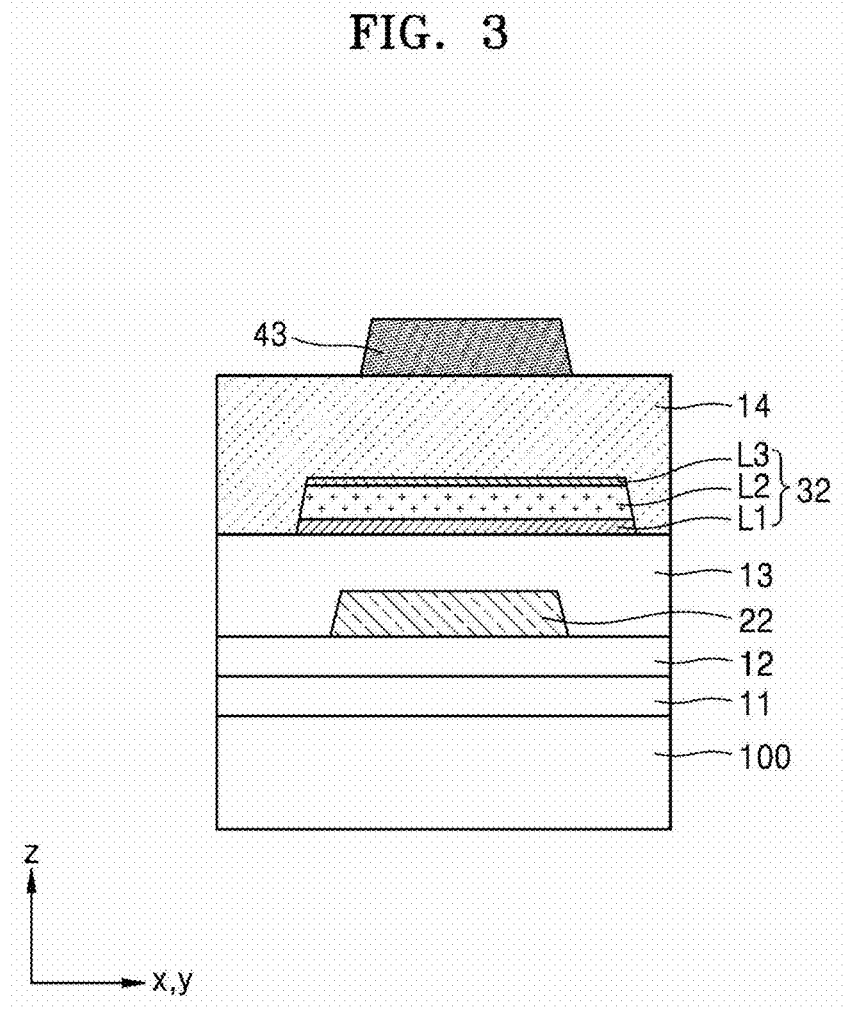
FIG. 3 is a cross-sectional view of an enlarged portion of the display apparatus of FIG. 2.

FIG. 2 is a schematic cross-sectional view of a portion of a display apparatus according to an embodiment, and FIG. 3 is a cross-sectional view of an enlarged portion of the display apparatus of FIG. 2.

As shown in FIG. 2, the display apparatus according to an embodiment may include the substrate 100, a buffer layer 11, a semiconductor layer 120, a gate insulating layer 12, first conductive layer 21 and 22, an interlayer insulating layer 13, second conductive layer 31 and 32, a first organic insulating layer 14, third conductive layer 41, 42, and 43, a second organic insulating layer 15, a pixel electrode 51, a pixel-defining layer 52, and a spacer 53.

The display apparatus includes TFTs and a storage capacitor, and the TFTs and the storage capacitor may be implemented by these conductive layers and insulating layers. In an embodiment, for example, the display apparatus may include a pixel area PXL, a transistor area TR, a capacitor area CAP, and a pad area PAD, as shown in FIG. 2.

The pixel area PXL may emit light through the pixel electrode 51. A TFT having a structure including the semiconductor layer 120 and a gate electrode overlapping the semiconductor layer 120 and configured to function as a switch may be arranged in the transistor area TR.

A storage capacitor Cst for storing charges may be arranged in the capacitor area CAP. The pad 400, to which a printed circuit board and/or an IC may be electrically connected, may be arranged in the pad area PAD.

For convenience of illustration and description, FIG. 2 illustrates an embodiment where the pixel area PXL, the transistor area TR, and the capacitor area CAP do not overlap each other, but the disclosure is not limited thereto. In an alternative embodiment, for example, a portion of the transistor area TR may overlap the capacitor area CAP, the pixel area PXL may overlap the entire transistor area TR and capacitor area CAP, and various modifications may be made.

The substrate 100 may include at least one selected from various flexible or bendable materials. In an embodiment, for example, the substrate 100 may include glass, a metal, or polymer resin. In an embodiment, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multilayer structure including two layers including polymer resin as described above and a barrier layer arranged therebetween and including an organic material (for example, silicon oxide, silicon nitride, or silicon oxynitride), and various modifications may be made.

The buffer layer 11 including silicon oxide, silicon nitride, or silicon oxynitride may be disposed on the substrate 100. The buffer layer 11 may prevent diffusion of metal atoms or impurities from the substrate 100 to the semiconductor layer 120 disposed thereabove. In addition, the buffer layer 11 may allow the semiconductor layer 120 to be uniformly crystallized by controlling a heat supply rate during a crystallization process for forming the semiconductor layer 120.

A display element and a TFT electrically connected to the display element may be disposed on the substrate 100. The OLED being electrically connected to the TFT may mean that the pixel electrode 51 included in the OLED may be electrically connected to the TFT.

The TFT includes the semiconductor layer 120 including amorphous silicon, polycrystalline silicon, an organic semiconductor material, or an oxide semiconductor material. In addition, the TFT may include the first conductive layer 21 and 22 and a source/drain region of the semiconductor layer 120. The first conductive layer 21 and 22 is a gate wiring layer, and may include at least one selected from various conductive materials and may have a multilayer structure, for example, may include a Mo layer and an Al layer. Alternatively, the first conductive layer 21 and 22 may include a TiNx layer, an Al layer, and/or a Ti layer. The second conductive layer 31 and 32 may also include at least one selected from various conductive materials and may have a multilayer structure, for example, may include a Ti layer, an Al layer, and/or a Cu layer. A portion of the first conductive layer 21 and 22 overlapping the semiconductor layer 120 may function as the gate electrode of the TFT.

The semiconductor layer 120 may include a source region 121, a drain region 123, and a channel region 122. Portions 31a and 31b of the second conductive layer 31 and 32 may be connected to the semiconductor layer 120 including the source/drain region through through holes TH1 and TH2 defined in the interlayer insulating layer 13. The second conductive layer 31 and 32 may be a wiring which transfers various electrical signals, or a connection electrode.

In an embodiment, the gate insulating layer 12 including an inorganic material, such as silicon oxide, silicon nitride, and/or silicon oxynitride, may be disposed between the semiconductor layer 120 and the first conductive layer 21 and 22 to secure isolation between the semiconductor layer 120 and the first conductive layer 21 and 22 or to insulate the semiconductor layer 120 and the first conductive layer 21 and 22 from each other. In an embodiment, for example, the gate insulating layer 12 may have a shape corresponding to the entire surface of the substrate 100, and may have a structure in which the through holes TH1 and TH2 are defined or formed in preset portions. The gate insulating layer 12 may be disposed under the storage capacitor Cst and the pad 400.

The interlayer insulating layer 13 including an inorganic material, such as silicon oxide, silicon nitride, and/or silicon oxynitride, may be disposed above the first conductive layer 21 and 22, and the second conductive layer 31 and 32 may be disposed on the interlayer insulating layer 13. The second conductive layer 31 and 32 may have a multilayer structure including a plurality of layers.

In embodiments described herein, an insulating layer including an inorganic material, such as the gate insulating layer 12 and the interlayer insulating layer 13, may be provided or formed through chemical vapor deposition (CVD) or atomic layer deposition (ALD).

The first organic insulating layer 14 may be disposed on the second conductive layer 31 and 32. The first organic insulating layer 14 may cover an upper portion of the second conductive layer 31 and 32 and have a generally flat top surface, thereby serving as a planarization layer. The first organic insulating layer 14 may include an organic material, such as acryl, benzocyclobutene (BCB), or hexamethyldisiloxane (HMDSO). The first organic insulating layer 14 may be formed as (or defined by) a single layer or a multilayer, and various modifications may be made.

The third conductive layer 41, 42, and 43 may be disposed on the first organic insulating layer 14. The third conductive layer 41, 42, and 43 may have a same layer structure as the second conductive layer 31 and 32. The third conductive layer 41, 42, and 43 may have a multilayer structure including a plurality of layers.

The second organic insulating layer 15 may be disposed on the third conductive layer 41, 42, and 43. The second organic insulating layer 15 may cover an upper portions of the third conductive layer 41, 42, and 43 and have a generally flat top surface, thereby serving as a planarization layer. The second organic insulating layer 15 may include an organic material, such as acryl, BCB, or HMDSO. The second organic insulating layer 15 may be formed as a single layer or a multilayer, and various modifications may be made.

The pixel electrode 51 may be connected to the third conductive layer 41, 42, and 43 through a through hole TH4 defined or formed in the second organic insulating layer 15.

A display element may be disposed on the second organic insulating layer 15 of the substrate 100. An OLED may be used as the display element. The OLED may include, for example, the pixel electrode 51, an opposite electrode 55, and an intermediate layer 54 disposed therebetween and including an emission layer.

The pixel electrode 51 may be in contact with one of the second conductive layer 31 and 32 and/or the third conductive layer 41, 42, and 43 to be electrically connected to the TFT. The pixel electrode 51 may include a transmissive conductive layer including a transmissive conductive oxide, such as indium tin oxide (ITO), $In_2O_3$, or indium zinc oxide (IZO), and a reflective layer including a metal, such as Al or Ag. In an embodiment, for example, the pixel electrode 51 may have a three-layer structure of ITO/Ag/ITO.

The pixel-defining layer 52 may be disposed above the second organic insulating layer 15 to cover the edge of the pixel electrode 51. The pixel-defining layer 52 may define a pixel by an opening defined therein to correspond to each pixel. In such an embodiment, an opening through which at least a central portion of the pixel electrode 51 is exposed may be defined through the pixel-defining layer. In addition, the pixel-defining layer 52 may prevent an arc or the like from occurring on the edge of the pixel electrode 51 by increasing a distance between the edge of the pixel electrode 51 and the opposite electrode 55. The pixel-defining layer 52 may include an organic material, for example, polyimide or HMDSO. In addition, the spacer 53 may be further disposed on the pixel-defining layer 52.

The intermediate layer 54 of the OLED, which is disposed on a portion of the pixel electrode 51, which is exposed by not being covered by the pixel-defining layer 52, may include a low molecular weight material or a polymer material. A portion of the intermediate layer 54 may be disposed on the pixel-defining layer 52 as well as on the pixel electrode 51. In an embodiment, where the intermediate layer 54 includes a low molecular weight material, the intermediate layer 54 may include a hole injection layer, a hole transport layer, an emission layer, an electron transport layer, and/or an electron injection layer. In an embodiment, where the intermediate layer 54 includes a polymer material, the intermediate layer 54 may generally have a structure including a hole transport layer and an emission layer. Such layers may be formed by deposition, inkjet printing, screen printing, or laser induced thermal imaging (LITI).

In embodiments, the structure of the intermediate layer 54 is not limited to that described above, and may have one of other various structures. In addition, the intermediate layer 54 may include a layer that is integrally formed over the pixel electrodes 51, and may include a layer that is patterned to correspond to each of the pixel electrodes 51.

The opposite electrode 55 is disposed above the pixel area PXL or the display area DA (see FIG. 1). In an embodiment, the opposite electrode 55 is integrally formed over the OLEDs, and thus, may correspond to the pixel electrodes 51. The opposite electrode 55 may include a transmissive conductive layer including ITO, $In_2O_3$, or IZO, and may include a semipermeable layer including a metal, such as Al or Ag. In an embodiment, for example, the opposite electrode 55 may be a semipermeable layer including MgAg.

The OLED may be easily damaged by moisture or oxygen from the outside, and thus, an encapsulation layer (not shown) may be further provided to cover and protect the OLEDs. The encapsulation layer (not shown) may cover the display area DA and extend to the outside of the display area DA.

The pad 400 may be arranged in the pad area PAD. The pad area PAD may be a portion of the peripheral area PA. As described above, the pad 400 overlaps a portion of a connection wiring, and thus, may be electrically connected to signal lines arranged in the display area DA through the connection wiring. In an embodiment, the pad 400 may have a multilayer structure including a plurality of layers. In such an embodiment, where the pad 400 has a multilayer structure, the pad 400 may include a first pad 23, a second pad 33, and a third pad 44. The second pad 33 may be connected to the first pad 23 through a through hole TH3 defined in the interlayer insulating layer 13. The pad 400 will be described in greater detail below.

In an embodiment, as shown in FIG. 3, the display apparatus may include the second conductive layer 32 disposed on the interlayer insulating layer 13, the first organic insulating layer 14 disposed on the second conductive layer 32, and the third conductive layer 43 disposed on the first organic insulating layer 14, as described above. In such an embodiment, the third conductive layer 43 may have an area (e.g., a planar area when viewed in the z direction) smaller than an area of the second conductive layer 32.

The second conductive layer 32 may include a first layer L1 disposed on the interlayer insulating layer 13 and including a first metal, a second layer L2 including a second metal and disposed on the first layer L1, and a third layer L3 including the first metal and disposed on the second layer L2. In an embodiment, the first metal may include titanium (Ti), and the second metal may include aluminum (Al).

The first layer L1 may have a first thickness, the second layer L2 may have a second thickness, and the third layer L3 may have a third thickness. In an embodiment, the third thickness may be about 400 angstrom (Å) or greater and about 1,000 Å or less, for example, about 500 Å or greater and about 700 Å or less. In such an embodiment, the second thickness may be about 2,000 Å or greater and about 7,000 Å or less, for example, about 6,000 Å.

The third thickness may be less than or equal to the first thickness. In an embodiment, for example, where the first thickness is about 500 Å, the third thickness may be about 400 Å or greater and about 500 Å or less. In an embodiment, for example, where the first thickness is about 700 Å, the third thickness may be about 400 Å or greater and about 700 Å or less.

When the display apparatus having the above-described structure is manufactured, the first organic insulating layer 14 may be formed by forming a layer for forming the first organic insulating layer 14 and then applying heat to the layer. In an embodiment, for example, the first organic insulating layer 14 may be formed by coating a monomer layer to a substrate and then applying heat to the monomer layer to achieve crosslinking. If the first thickness of the third layer L3 is less than about 400 Å, in the process of forming the first organic insulating layer 14 as described above, a hillock phenomenon may occur in the second layer L2 due to heat applied to the display apparatus during a manufacturing process. In a case where the second metal includes aluminum, the second layer L2 may include a plurality of grains. In this case, there may be a certain distance between the grains. When heat is applied to aluminum, each of the grains expands, such that a distance between the grains may decrease, and adjacent grains may come into contact with each other, and as the grains collide and a portion thereof rises, irregularities may be formed on the top surface of the layer including aluminum. A phenomenon in which irregularities are formed on the top surface of a layer including aluminum is referred to as a hillock phenomenon.

As a defect inspection process is performed during a process of manufacturing a display apparatus, the irregularities formed by the hillock phenomenon are observed similarly to particles that are impurities located on a layer, and it is not easy to distinguish such particles from the irregularities formed by the hillock phenomenon. Therefore, even though a display apparatus does not include particles that are impurities, there is a problem that a display apparatus in which the hillock phenomenon has occurred may be regarded as defective in the defect inspection process and may be discarded.

If the first thickness of the third layer L3 is greater than about 700 Å, the overall manufacturing process cost increases due to the excessive thickness of the third layer L3, and the time spent for forming the third layer L3 increases. Thus, other defects (for example, particle formation and non-uniform layer formation) may be more likely to occur. Accordingly, in an embodiment, the thickness of the third layer L3 may be about 500 Å or greater and about 700 Å or less.

The temperature for forming the first organic insulating layer 14 may be about 250 degrees Celsius or greater and about 300 degrees Celsius or less. That is, the first organic insulating layer 14 may include a material which is formed at a temperature of about 250 degrees Celsius or greater and about 300 degrees Celsius or less. The first organic insulating layer 14 may be polymerized or cured by heating.

Figure 4:
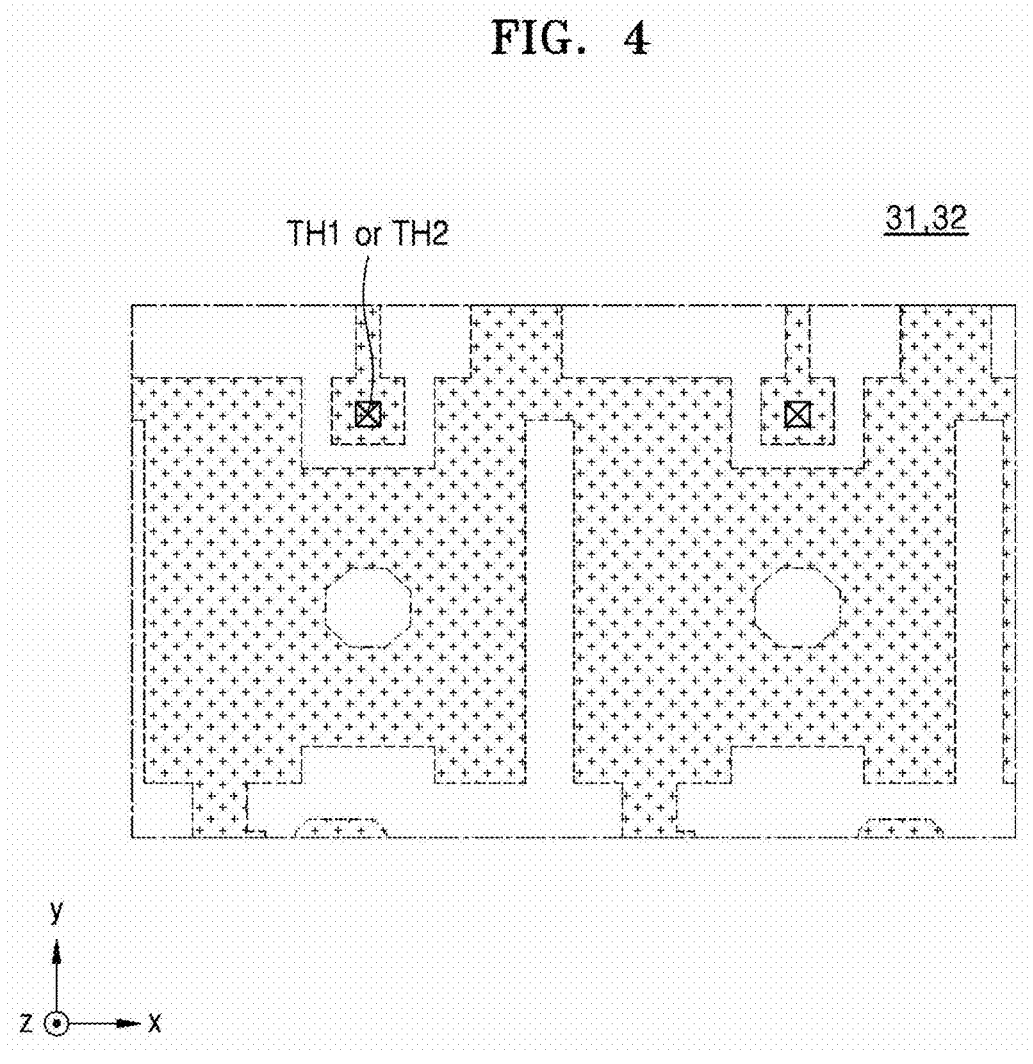
FIG. 4 is a schematic plan view of a second conductive layer according to an embodiment.
Figure 5:
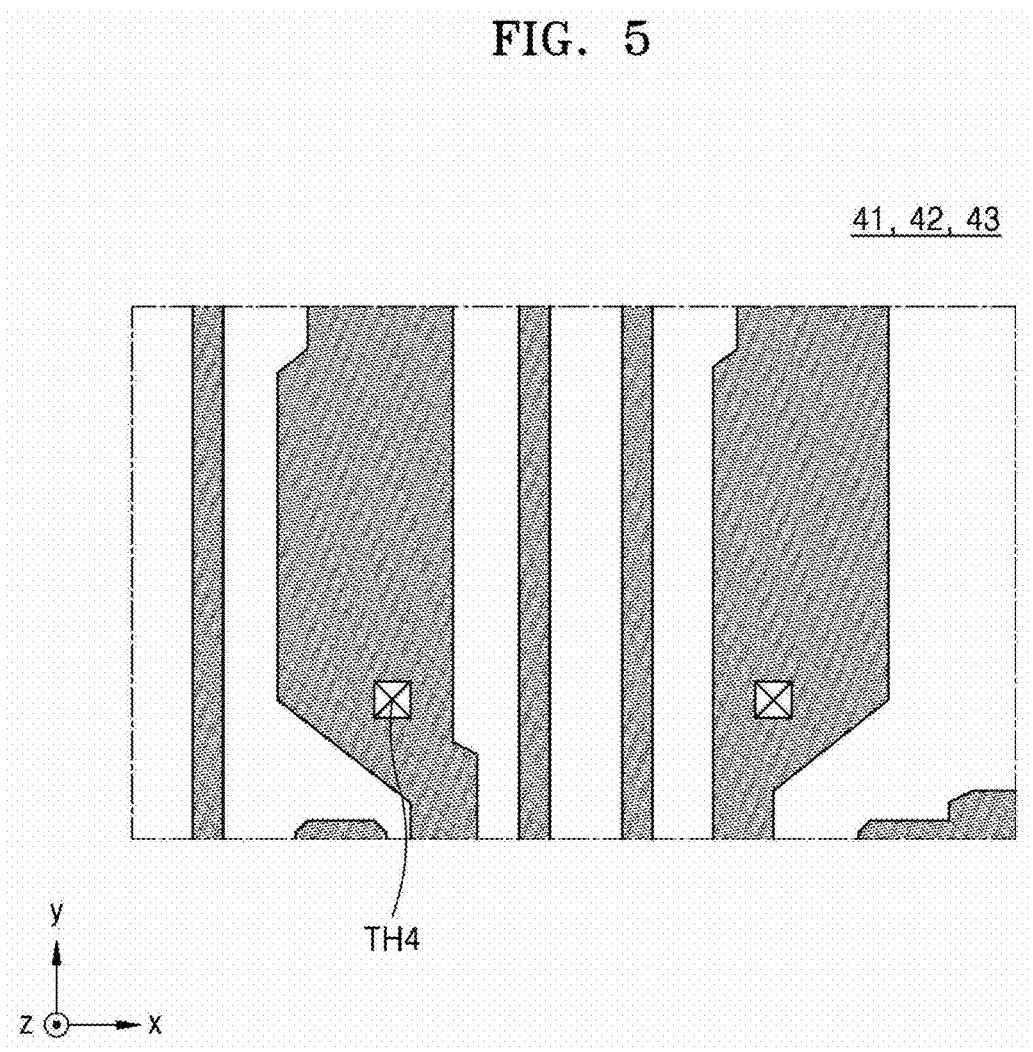
FIG. 5 is a schematic plan view of a third conductive layer according to an embodiment.
Figure 6:
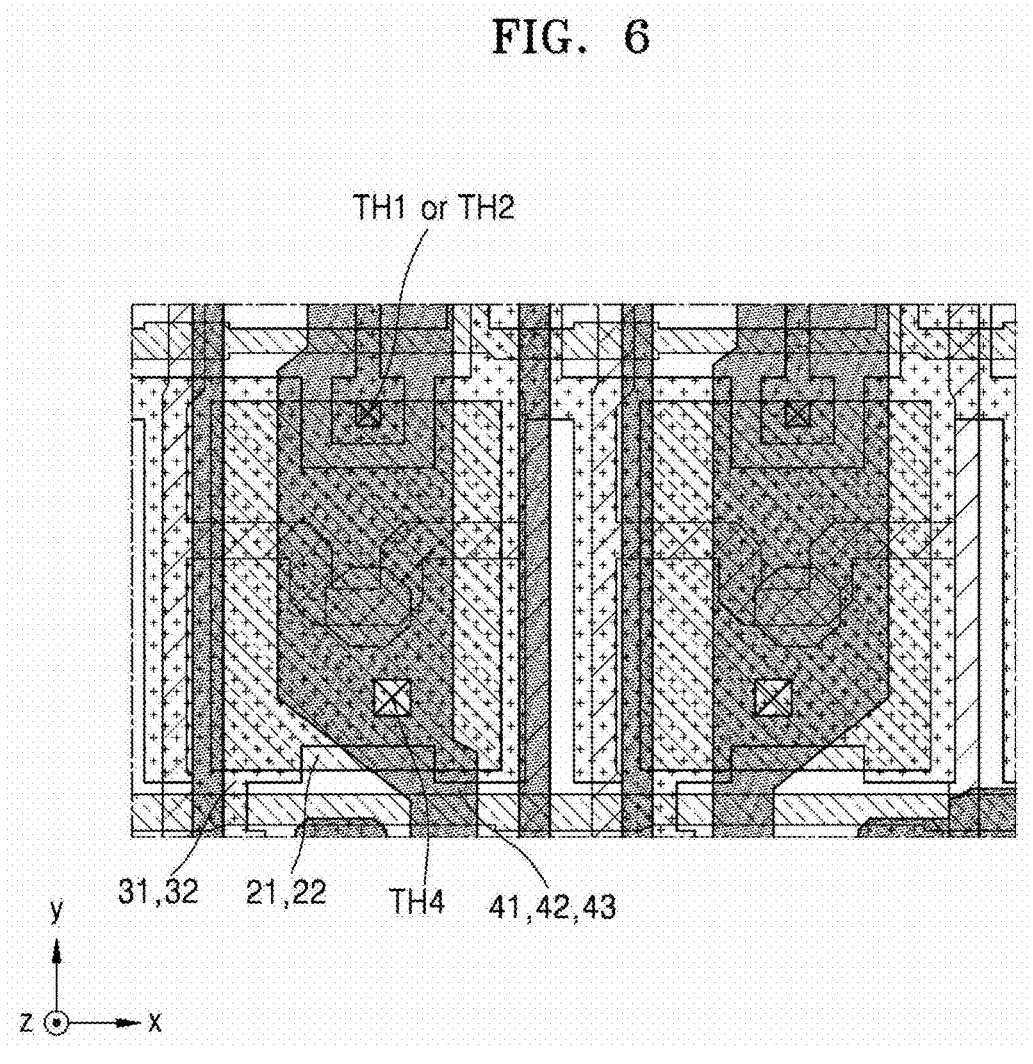
FIG. 6 is a schematic plan view of stacked pixel wirings according to an embodiment.

FIG. 4 is a schematic plan view of the second conductive layer according to an embodiment, FIG. 5 is a schematic plan view of the third conductive layer according to an embodiment, and FIG. 6 is a schematic plan view of stacked pixel wirings according to an embodiment.

In an embodiment, as shown in FIGS. 4 and 5, an area of the second conductive layer 31 and 32 may be greater than an area of the third conductive layer 41, 42, and 43. In such an embodiment, the area of the conductive layer may mean the size (width) of a portion thereof in one pixel unit. In FIGS. 4 and 5, respective conductive layers for two pixels are shown in a same proportion.

In such an embodiment, since the area of the second conductive layer 31 and 32 is greater than the area of the third conductive layer 41, 42, and 43, an aluminum hillock phenomenon is highly likely to occur mainly in the second conductive layer 31 and 32. In addition, according to a stacking process, the second conductive layer 31 and 32 disposed lower than the third conductive layer 41, 42, and 43 may receive heat for forming the first organic insulating layer 14, and may receive additional heat for forming the second organic insulating layer 15. Since the degree of thermal expansion of aluminum due to heat increases as the cross-sectional area to which heat is transferred increases, it is desired to adjust the thickness of the third layer L3 to protect the second layer L2 in a case where the area of the second conductive layer 31 and 32 is greater than the area of the third conductive layer 41, 42, and 43.

In an embodiment, as shown in FIG. 6, the second conductive layer 31 and 32 of FIG. 4 and the third conductive layer 41, 42, and 43 of FIG. 5 are stacked one on another. In addition, the first conductive layer 21 and 22 apart from each other is disposed on the semiconductor layer 120, the second conductive layer 31 and 32 apart from each other is disposed on the first conductive layer 21 and 22, and the third conductive layer 41, 42, and 43 apart from each other is disposed on the second conductive layer 31 and 32.

As shown in FIG. 6, a portion for forming a transistor and a portion for forming a storage capacitor may be integrally formed with each other as a single unitary part, or may be formed as separate portions as shown in FIG. 2.

Figure 7:
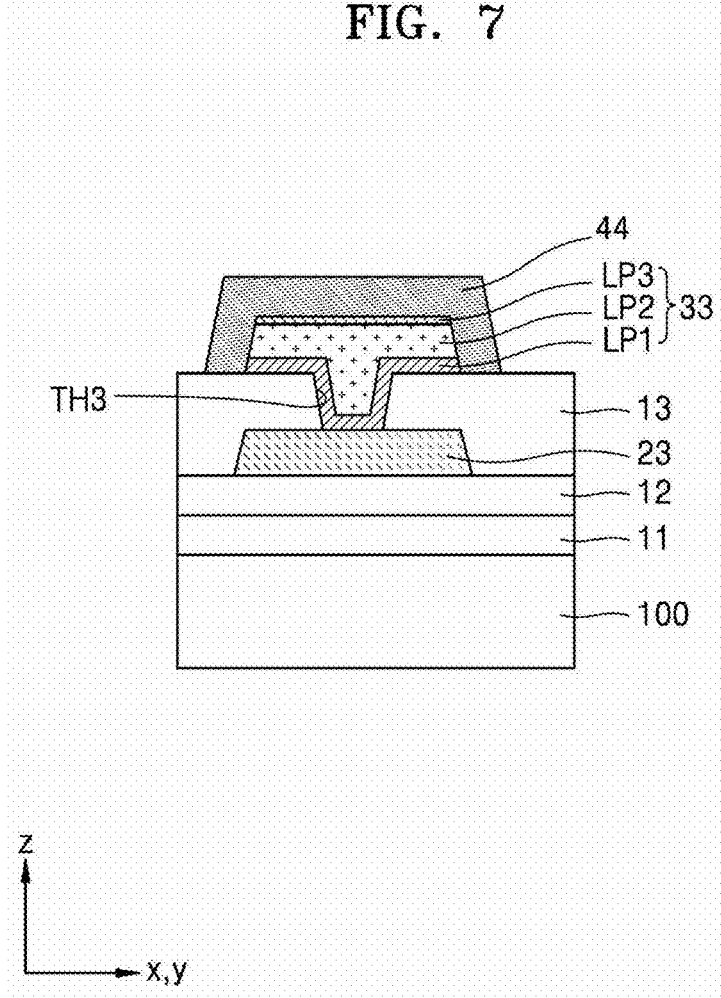
FIG. 7 is a schematic cross-sectional view of a pad according to an embodiment.

FIG. 7 is a schematic cross-sectional view of a pad according to an embodiment.

In an embodiment, as shown in FIG. 7, the pad 400 (see FIG. 2) may include the first pad 23 disposed on the substrate 100, the second pad 33 disposed on the first pad 23, and the third pad 44 disposed on the second pad 33.

The first pad 23 may include a same material as the first conductive layer 21 and 22, and may have a same layer structure as the first conductive layer 21 and 22. The second pad 33 may include a same material as the second conductive layer 31 and 32, and may have a same layer structure as the second conductive layer 31 and 32. The third pad 44 may include a same material as the third conductive layer 41, 42, and 43, and may have a same layer structure as the third conductive layer 41, 42, and 43. The third pad 44 may be formed to cover the entire top surface of the second pad 33. In addition, the third pad 44 may be in direct contact with the top surface of the second pad 33.

In an embodiment, the first pad 23 may have a single layer structure or a multilayer structure. In an embodiment, the first pad 23 may be formed together with the first conductive layer 21 and 22. Therefore, the first pad 23 may have a same layer structure as the first conductive layer 21 and 22.

In an embodiment, the second pad 33 may have a single layer structure or a multilayer structure. In an embodiment, the second pad 33 may be formed together with the second conductive layer 31 and 32. Therefore, the second pad 33 may have a same layer structure as the second conductive layer 31 and 32.

In an embodiment, the third pad 44 may have a single layer structure or a multilayer structure. In an embodiment, the third pad 44 may be formed together with the third conductive layer 41, 42, and 43. Therefore, the third pad 44 may have a same layer structure as the third conductive layer 41, 42, and 43.

In an embodiment, as shown in FIG. 7, the second pad 33 may include a first pad layer LP1 including the first metal, a second pad layer LP2 including the second metal and disposed on the first pad layer LP1, and a third pad layer LP3 including the first metal and disposed on the second pad layer LP2. In such an embodiment, the first pad layer LP1 and the third pad layer LP3 include titanium (Ti), and the second pad layer LP2 may include aluminum (Al).

The first pad layer LP1 may have a fourth thickness, the second pad layer LP2 may have a fifth thickness, and the third pad layer LP3 may have a sixth thickness. In such an embodiment, the sixth thickness may be about 400 Å or greater and about 1,000 Å or less, for example, about 500 Å or greater and about 700 Å or less. The fifth thickness may be about 2,000 Å or greater and about 7,000 Å or less, or may be about 6,000 Å. In addition, the sixth thickness may be less than or equal to the fourth thickness. In such an embodiment, the thicknesses of the first pad layer LP1, the second pad layer LP2, and the third pad layer LP3 may be the same as the thicknesses of the first layer L1, the second layer L2, and the third layer L3, respectively.

In such an embodiment, characteristics of the first, second, and third pad layers LP1, LP2, and LP3 forming the second pad 33 may be equally applied to a plurality of layers forming the third pad 44. Since the third pad 44 is formed together with the third conductive layer 41, 42, and 43, the third pad 44 may identically include the characteristics of a plurality of layers forming the third conductive layer 41, 42, and 43 (see FIG. 4).

As shown in FIG. 7, the second pad 33 may be connected to the first pad 23 through the through hole TH3 defined in the interlayer insulating layer 13. The interlayer insulating layer 13 may be disposed between the first pad 23 and the second pad 33.

The first pad layer LP1 may be disposed on the interlayer insulating layer 13, and may be formed along a side wall of the interlayer insulating layer 13 defining the through hole TH3. In addition, a fourth layer L4 may be formed on an area in which the bottom surface of the through hole TH3 and the top surface of the first conductive layer 22 overlap each other. The second pad layer LP2 may be disposed on the first pad layer LP1. The second pad layer LP2 may be formed to fill the through hole TH3. The third pad layer LP3 may be disposed on the second pad layer LP2.

Figure 8:
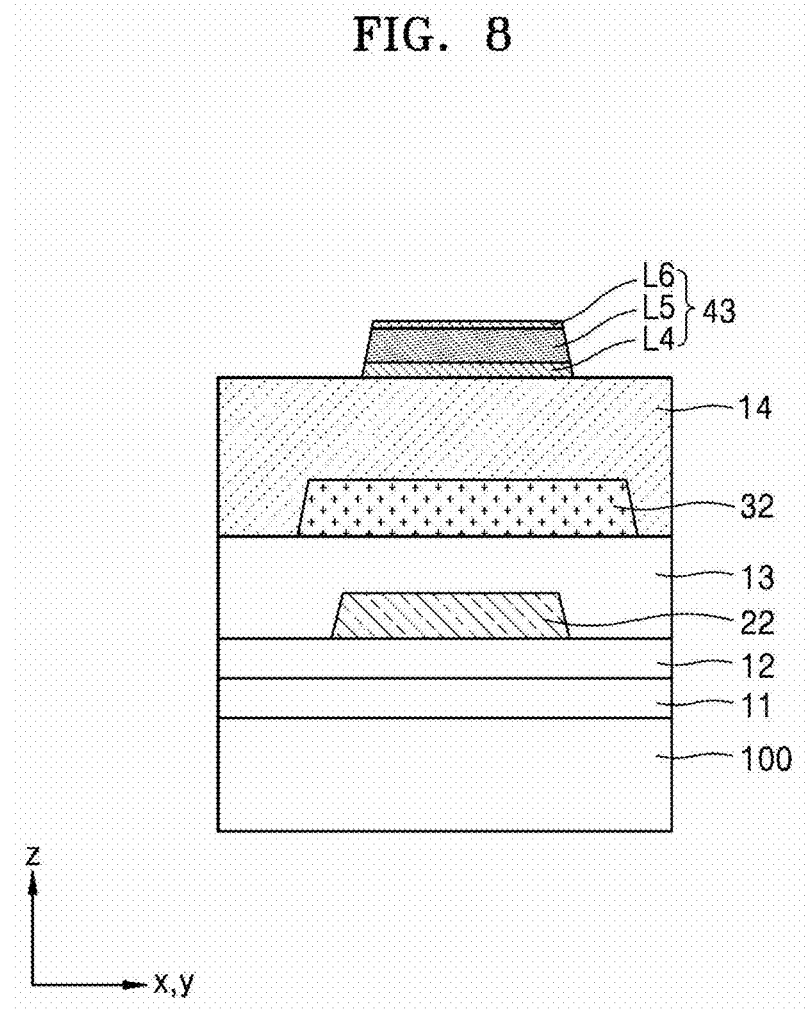
FIG. 8 is a schematic cross-sectional view of a third conductive layer according to an embodiment.
Figure 9:
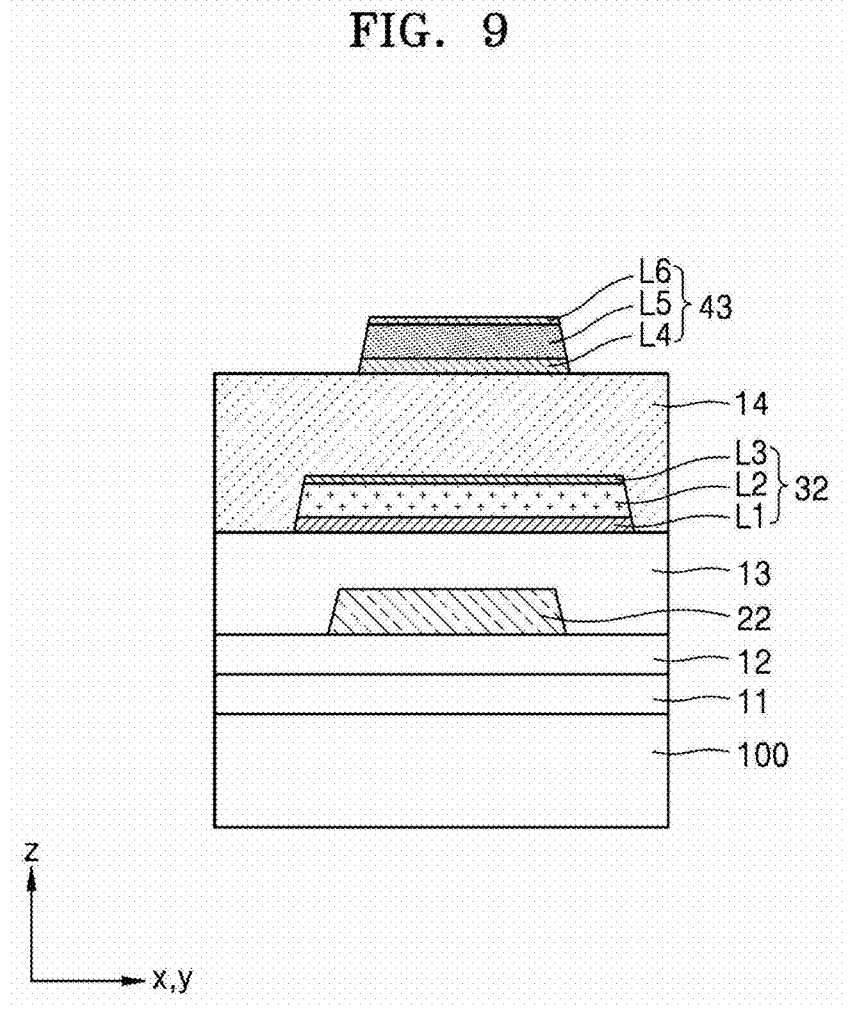
FIG. 9 is a schematic cross-sectional view of a second conductive layer and a third conductive layer according to an embodiment.

FIG. 8 is a schematic cross-sectional view of a third conductive layer according to an embodiment, and FIG. 9 is a schematic cross-sectional view of a second conductive layer and a third conductive layer according to an embodiment.

In an embodiment, as shown in FIG. 8, the third conductive layer 43 may include the fourth layer L4 including the first metal and disposed on the first organic insulating layer 14, a fifth layer L5 including the second metal and disposed on the fourth layer L4, and a sixth layer L6 including the first metal and disposed on the fifth layer L5. In such an embodiment, the first metal may include titanium (Ti), and the second metal may include aluminum (Al).

The fourth layer L4 may have a seventh thickness, the fifth layer L5 may have an eighth thickness, and the sixth layer L6 may have a ninth thickness. In such an embodiment, the ninth thickness may be about 400 Å or greater and about 1,000 Å or less, for example, about 500 Å or greater and about 700 Å or less. The eighth thickness may be about 2,000 Å or greater and about 7,000 Å or less, or may be about 6,000 Å. In addition, the ninth thickness may be less than or equal to the seventh thickness. In such an embodiment, the thicknesses of the fourth layer L4, the fifth layer L5, and the sixth layer L6 may be the same as the thicknesses of the first layer L1, the second layer L2, and the third layer L3 of FIG. 5, respectively.

In an embodiment, as described above, even when the area of the second conductive layer 31 and 32 is greater than the area of the third conductive layer 43, the third conductive layer 43 may include stains generated by receiving heat for forming the second organic insulating layer 15. The stains may be generated by the aluminum hillock phenomenon. Therefore, it may be desired to adjust the thickness of the sixth layer L6 to protect the fifth layer L5 including aluminum in the third conductive layer 43 from the heat for forming the second organic insulating layer 15. The temperature for forming the second organic insulating layer 15 may be about 250 degrees Celsius or greater and about 300 degrees Celsius or less. That is, the second organic insulating layer 15 may include a material, which is formed at a temperature of about 250 degrees Celsius or greater and about 300 degrees Celsius or less.

In an embodiment, as shown in FIG. 9, each of the second conductive layer 32 and the third conductive layer 43 includes a plurality of layers, and the uppermost layer of the plurality of layers may include the first metal and a certain thickness. In such an embodiment, the certain thickness may be about 400 Å or greater and about 1,000 Å or less, for example, about 500 Å or greater and about 700 Å or less.

In an embodiment, the second layer L2 may include the first layer L1, the second layer L2, and the third layer L3, and the third conductive layer 43 may include the fourth layer L4, the fifth layer L5, and the sixth layer L6. In such an embodiment, the first metal may include titanium (Ti), and the second metal may include aluminum (Al). Any repetitive detailed descriptions of the same or like features as those described above will be omitted.

Figure 10:
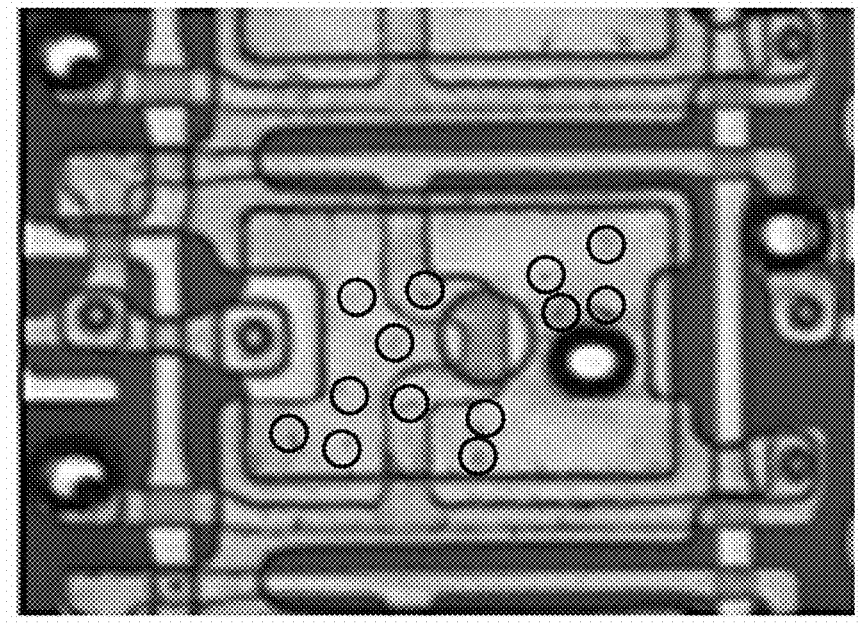
FIG. 10 is an image of a conductive layer in which a hillock phenomenon has occurred.
Figure 11:
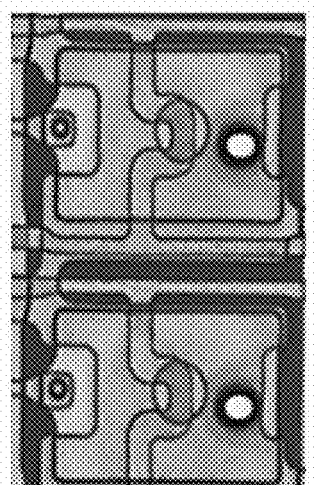
FIGS. 11 to 13 are images showing that a hillock phenomenon has not occurred in a display apparatus according to embodiments of the disclosure.
Figure 12:
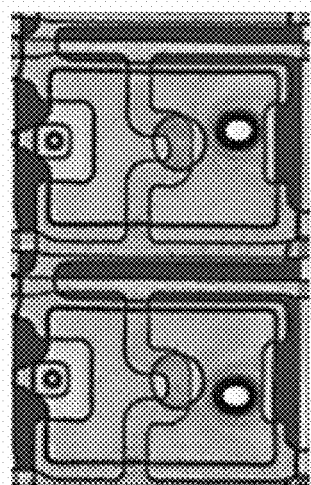
Figure 13:
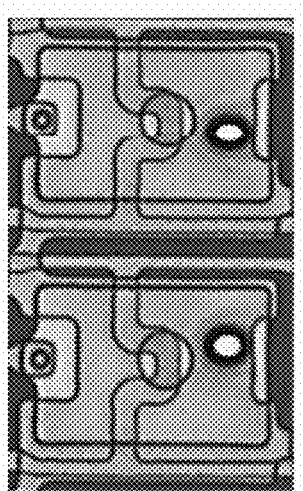

FIG. 10 is an image of a conductive layer in which a hillock phenomenon occurred, and FIGS. 11 to 13 are images showing that a hillock phenomenon did not occur in a display apparatus according to embodiments of the disclosure.

As shown in FIG. 10, in a case where the thickness of the third layer L3 was 300 Å, an aluminum hillock phenomenon occurred in the second conductive layer 31 and 32 after the first organic insulating layer 14 was formed in a certain process. In FIG. 10, spots or stains observed in a defect inspection process due to the occurrence of hillock are indicated by circles. In this case, when the hillock phenomenon occurs in the second conductive layer 31 and 32, a portion where the hillock phenomenon has occurred may be observed to be the same as or similar to impurities in the defect inspection process. Therefore, even though a display apparatus does not include particles that are impurities, a display apparatus in which the hillock phenomenon has occurred may be regarded as a defective panel in which particles are generated in the defect inspection process and may be discarded. Therefore, it is desired to effectively prevent or substantially minimize the hillock phenomenon from occurring in the second conductive layer 31 and 32, which may be the same for the third conductive layer 41, 42, and 43.

As shown in FIG. 11, in an embodiment where the thickness of the third layer L3 was 500 Å, a hillock phenomenon did not occur in a certain process (under the same condition as the experiment of FIG. 10). As shown in FIG. 12, in an embodiment where the thickness of the third layer L3 was 700 Å, the hillock phenomenon did not occur in the certain process (under the same condition as the experiment of FIG. 10). As shown in FIG. 13, in an embodiment where the thickness of the third layer L3 was 1,000 Å, the hillock phenomenon did not occur in the certain process (under the same condition as the experiment of FIG. 10).

In each conductive layer of FIGS. 10 to 13, the thickness of the first layer L1 was 700 Å, the thickness of the second layer L2 was 6,000 Å, the heating temperature for forming the first organic insulating layer 14 was 270 degrees Celsius, the first layer L1 and the third layer L3 included titanium (Ti), the second layer L2 included aluminum (Al), and all other conditions were set to be the same as each other.

As described above, it was confirmed that when the third layer L3 included titanium, the hillock phenomenon did not occur in the second layer L2 in a case where the thickness of the third layer L3 was 500 Å, 700 Å, and 1,000 Å. However, when the thickness of the third layer L3 is greater than the thickness of the first layer L1, the material cost during a manufacturing process may be undesirably high and the manufacturing time may be increased.

Figure 14:
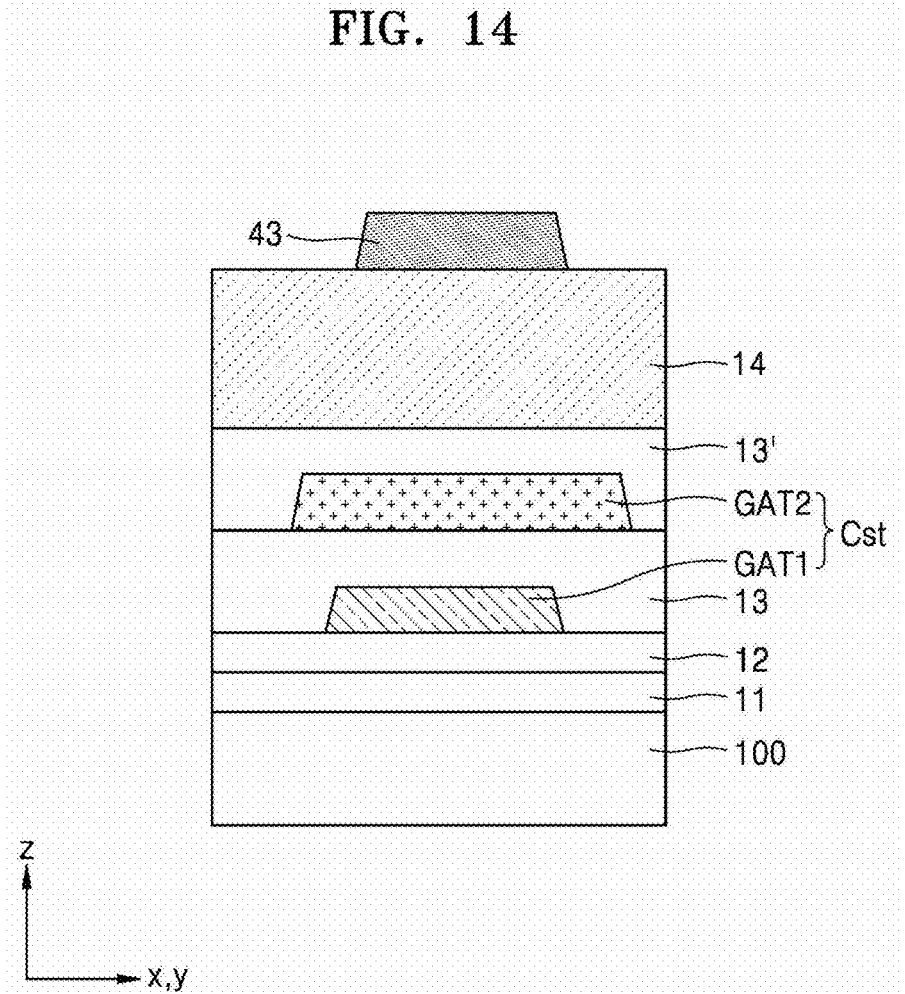
FIG. 14 is a cross-sectional view of a partial area of a pixel including a storage capacitor by using a gate wiring.

FIG. 14 is a cross-sectional view of a partial area of a pixel including a storage capacitor. The storage capacitor includes two electrodes that are apart from each other, and thus, may be part of two gate wirings that are apart from each other.

As shown in FIG. 14, a display apparatus according to a comparative example may include the substrate 100, the buffer layer 11, the gate insulating layer 12, a first gate layer GAT1, the interlayer insulating layer 13, a second gate layer GAT2, an additional interlayer insulating layer 13', the first organic insulating layer 14, and a conductive layer 43. At this time, a portion of the first gate layer GAT1 and a portion of the second gate layer GAT2 may overlap each other to form the storage capacitor Cst.

In the comparative example, where the storage capacitor Cst is formed using two gate wirings, interlayer insulating layers for respective gate wirings are provided, and an organic insulating layer is also provided on the interlayer insulating layer. Accordingly, in an embodiment, in an embodiment, the second conductive layer 31 and 32 may be provided instead of the second gate layer GAT2 to reduce the thickness of the display panel 10 and simplify a process.

According to an embodiment, a display apparatus in which the occurrence of hillock may be effectively prevented or substantially minimized may be implemented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
a substrate;
a semiconductor layer disposed on the substrate, wherein the semiconductor layer comprises a source region and a drain region;
a gate insulating layer disposed on the semiconductor layer;
a first conductive layer disposed on the gate insulating layer;
an interlayer insulating layer disposed on the first conductive layer;
a second conductive layer comprising:
a first layer comprising a first metal and disposed on the interlayer insulating layer;
a second layer comprising a second metal and disposed on the first layer; and a third layer comprising the first metal and disposed on the second layer;
a first organic insulating layer disposed on the second conductive layer;
a third conductive layer disposed on the first organic insulating layer, wherein the third conductive layer has an area smaller than an area of the second conductive layer;
a first pad disposed on the substrate;
a second pad disposed on the first pad; and
a third pad disposed on the second pad,
wherein the interlayer insulating layer is disposed between the first pad and the second pad, and the second pad is connected to the first pad through a through hole defined in the interlayer insulating layer.

2. The display apparatus of claim 1, wherein
the first layer has a first thickness,
the second layer has a second thickness,
the third layer has a third thickness, and
the third thickness is about 500 Å or greater and about 700 Å or less.

3. The display apparatus of claim 2, wherein the third thickness is less than or equal to the first thickness.

4. The display apparatus of claim 1, wherein
the first metal comprises titanium (Ti), and
the second metal comprises aluminum (Al).

5. The display apparatus of claim 1, wherein the first organic insulating layer includes a material which is formed at a temperature of about 250 degrees Celsius or greater and 300 degrees Celsius or less.

6. The display apparatus of claim 1, further comprising:
a second organic insulating layer disposed on the third conductive layer;
a pixel electrode disposed on the second organic insulating layer and connected to the third conductive layer through a through hole defined in the second organic insulating layer;
a pixel-defining layer disposed on the second organic insulating layer and covering an edge of the pixel electrode; and
a spacer disposed on the pixel-defining layer.

7. The display apparatus of claim 6, wherein the third conductive layer comprises:
a fourth layer comprising the first metal and disposed on the first organic insulating layer;
a fifth layer comprising the second metal and disposed on the fourth layer; and
a sixth layer comprising the first metal and disposed on the fifth layer.

8. The display apparatus of claim 7, wherein
the fourth layer has a seventh thickness,
the fifth layer has an eighth thickness,
the sixth layer has a ninth thickness, and
the ninth thickness is about 500 Å or greater and about 700 Å or less.

9. The display apparatus of claim 8, wherein the ninth thickness is less than or equal to the seventh thickness.

10. The display apparatus of claim 7, wherein
the first metal comprises titanium (Ti), and
the second metal comprises aluminum (Al).

11. The display apparatus of claim 7, wherein the second organic insulating layer comprises a material which is formed at a temperature of about 250 degrees Celsius or greater and about 300 degrees Celsius or less.

12. The display apparatus of claim 1, wherein the second pad comprises:
a first pad layer comprising the first metal;

a second pad layer comprising the second metal and disposed on the first pad layer; and a third pad layer comprising the first metal and disposed on the second pad layer.

13. The display apparatus of claim 12, wherein the first pad layer has a fourth thickness, the second pad layer has a fifth thickness, the third pad layer has a sixth thickness, and the sixth thickness is about 500 Å or greater and about 700 Å or less.

14. The display apparatus of claim 13, wherein the sixth thickness is less than or equal to the fourth thickness.

15. The display apparatus of claim 12, wherein the first metal comprises titanium (Ti), and the second metal comprises aluminum (Al).

16. The display apparatus of claim 1, wherein the first pad comprises a same material as the first conductive layer and has a same layer structure as the first conductive layer, and the second pad comprises a same material as the second conductive layer and has a same layer structure as the second conductive layer.

17. The display apparatus of claim 1, wherein the third pad covers an entire portion of a top surface of the second pad.

18. The display apparatus of claim 17, wherein the top surface of the second pad is in direct contact with the third pad.

\* \* \* \* \*